United States Patent
Yang

(10) Patent No.: US 9,437,328 B2
(45) Date of Patent: Sep. 6, 2016

(54) APPARATUS AND METHOD FOR APPLYING AT-SPEED FUNCTIONAL TEST WITH LOWER-SPEED TESTER

(71) Applicant: Silicon Motion Inc., Hsinchu County (TW)

(72) Inventor: Tsung-Chieh Yang, Hsinchu (TW)

(73) Assignee: Silicon Motion Inc., Hsinchu County (TW)

( * ) Notice: Subject to any disclaimer, the term of this patent is extended or adjusted under 35 U.S.C. 154(b) by 131 days.

(21) Appl. No.: 14/089,730

(22) Filed: Nov. 25, 2013

(65) Prior Publication Data

US 2014/0157067 A1    Jun. 5, 2014

Related U.S. Application Data

(60) Provisional application No. 61/731,482, filed on Nov. 30, 2012.

(51) Int. Cl.
  *G11C 29/56* (2006.01)
  *G11C 29/14* (2006.01)
  *G06F 11/10* (2006.01)

(52) U.S. Cl.
  CPC ..... *G11C 29/56012* (2013.01); *G06F 11/1048* (2013.01); *G11C 29/14* (2013.01); *G11C 29/56004* (2013.01); *G11C 2029/5602* (2013.01)

(58) Field of Classification Search
  CPC .......... G11C 29/56012; G11C 29/56004; G11C 2029/5602; G06F 11/1048
  See application file for complete search history.

(56) References Cited

U.S. PATENT DOCUMENTS

| | | | | |
|---|---|---|---|---|
| 5,177,630 A * | 1/1993 | Goutzoulis | ............. | H04J 14/08 356/388 |
| 5,267,212 A * | 11/1993 | Takashima | ............. | G11C 29/34 365/201 |
| 5,524,114 A * | 6/1996 | Peng | ................ | G01R 31/31919 375/327 |
| 5,831,994 A * | 11/1998 | Takino | ................. | G01R 1/0408 714/724 |
| 6,195,772 B1 * | 2/2001 | Mielke | ................ | G01R 31/3016 324/73.1 |
| 6,345,373 B1 * | 2/2002 | Chakradhar | ..... | G01R 31/31707 714/724 |
| 6,469,684 B1 * | 10/2002 | Cole | .................... | G09G 3/3614 345/58 |
| 6,489,819 B1 * | 12/2002 | Kono | ..................... | G11C 29/14 327/141 |
| 6,636,110 B1 * | 10/2003 | Ooishi | ...................... | G06F 1/10 327/295 |

(Continued)

FOREIGN PATENT DOCUMENTS

| CN | 1702635 A | 11/2005 |
|---|---|---|
| CN | 1802811 A | 7/2006 |

(Continued)

*Primary Examiner* — Joseph D Torres
(74) *Attorney, Agent, or Firm* — Winston Hsu; Scott Margo

(57) ABSTRACT

A device under test has a connection interface, a controller, and a functional block. The connection interface is used to receive a test pattern transmitted at a first clock rate and output a functional test result. The controller is used to sample the test pattern by using a second clock rate and accordingly generate a sampled test pattern, wherein the second clock rate is higher than the first clock rate. The functional block is used to perform a designated function upon the sampled test pattern and accordingly generate the functional test result.

10 Claims, 5 Drawing Sheets

(56) References Cited

U.S. PATENT DOCUMENTS

| | | | |
|---|---|---|---|
| 6,701,476 B2 | 3/2004 | Pouya | |
| 7,228,476 B2 * | 6/2007 | Scipioni | G01R 31/31937 714/733 |
| 7,600,162 B2 * | 10/2009 | Nishizawa | G01R 31/31715 714/700 |
| 7,730,368 B2 * | 6/2010 | Murin | G11C 11/5621 365/201 |
| 7,852,099 B1 * | 12/2010 | Clark | G01R 31/31908 324/750.3 |
| 7,900,102 B2 | 3/2011 | Sokolov | |
| 2002/0170003 A1 * | 11/2002 | Hirabayashi | G11C 29/14 714/42 |
| 2003/0177423 A1 * | 9/2003 | Komatsu | G01R 31/31716 714/700 |
| 2004/0098650 A1 * | 5/2004 | Rajsuman | G11C 29/56 714/742 |
| 2004/0100839 A1 * | 5/2004 | Kim | G11C 29/12 365/201 |
| 2004/0133834 A1 * | 7/2004 | Kanemitsu | G01R 31/31932 714/742 |
| 2005/0246602 A1 * | 11/2005 | Bahl | G11C 29/006 714/733 |
| 2005/0258856 A1 * | 11/2005 | Kishimoto | G01R 31/31712 324/762.02 |
| 2006/0109895 A1 * | 5/2006 | Watanabe | G01R 31/31922 375/224 |
| 2006/0259835 A1 * | 11/2006 | Marinissen | G01R 31/318371 714/724 |
| 2007/0022334 A1 * | 1/2007 | Kim | G11C 29/56 714/718 |
| 2008/0034265 A1 * | 2/2008 | Kang | G01R 31/3193 714/736 |
| 2008/0109690 A1 * | 5/2008 | Park | G01R 31/31703 714/732 |
| 2009/0259896 A1 * | 10/2009 | Hsu | G06F 11/1068 714/723 |

FOREIGN PATENT DOCUMENTS

| | | |
|---|---|---|
| CN | 101529518 A | 9/2009 |
| KR | 1020080005925 A | 1/2008 |
| TW | 200801558 | 1/2008 |
| TW | 201142332 | 12/2011 |

* cited by examiner

APPARATUS AND METHOD FOR APPLYING AT-SPEED FUNCTIONAL TEST WITH LOWER-SPEED TESTER

CROSS REFERENCE TO RELATED APPLICATIONS

This application claims the benefit of U.S. provisional application No. 61/731,482, filed on Nov. 30, 2012 and incorporated herein by reference.

BACKGROUND OF THE INVENTION

1. Field of the Invention

The disclosed embodiments of the present invention relate to testing semiconductor products, and more particularly, to an apparatus and method for applying an at-speed functional test with a lower-speed tester.

2. Description of the Prior Art

Scan chain is a technique used in a circuit design for scan test. More specifically, the scan chain provides a simple way to set and observe every flip-flop in a circuit design. A clock signal controls all of the flip-flops in the scan chain during a shift phase and a capture phase. Hence, a test pattern can be entered into the scan chain composed of flip-flops, and the state of every flip-flop can be read out to determine if the circuit design passes the scan test.

Growing gate counts and increasing timing defects with small fabrication technologies force improvements in test quality to maintain the quality level of chips delivered to customers after testing. Therefore, the scan chain based at-speed test may be used to maintain test quality for larger, more complex chips made using advanced fabrication processes. To realize the scan chain based at-speed test, a high-speed tester is required to feed the test pattern at a high clock rate to run the scan test on a device under test with a scan chain operating under the high clock rate. However, using the high-speed tester would increase the test cost inevitably.

SUMMARY OF THE INVENTION

In accordance with exemplary embodiments of the present invention, an apparatus and method for applying an at-speed functional test with a lower-speed tester are proposed.

According to a first aspect of the present invention, an exemplary device under test is disclosed. The exemplary device under test includes a connection interface, a controller and a functional block. The connection interface is arranged to receive a test pattern transmitted at a first clock rate and output a functional test result. The controller is arranged to sample the test pattern by using a second clock rate and accordingly generate a sampled test pattern, wherein the second clock rate is higher than the first clock rate. The functional block is arranged to perform a designated function upon the sampled test pattern and accordingly generate the functional test result.

In one embodiment, the device under test is a flash memory controller chip.

In one embodiment, the functional block is an error checking and correction (ECC) circuit. The designated function is an ECC decoding operation. The ECC circuit is arranged to use shared circuitry to perform an ECC encoding operation and the ECC decoding operation.

In one embodiment, the device under test further includes a clock generator. The clock generator is arranged to generate an internal reference clock to the controller and the functional block, wherein the internal reference clock has the second clock rate.

According to a second aspect of the present invention, a tester including a test pattern generator and a connection interface is disclosed. The test pattern generator is arranged to generate at least one test pattern. The connection interface is arranged to transmit the at least one test pattern to the device under test for an at-speed functional test, and receive at least one functional test result from the device under test, wherein the at least one test pattern is transmitted at a first clock rate which is lower than a second clock rate at which the device under test runs the at-speed functional test.

In one embodiment, each test pattern includes a one-cycle non-all-zero bit pattern sandwiched by a preceding one-cycle all-zero bit pattern and a following one-cycle all-zero bit pattern. For one example, the at least one test pattern may include a first test pattern and a second test pattern, the one-cycle non-all-zero bit pattern included in the first test pattern is identical to the one-cycle non-all-zero bit pattern included in the second test pattern, and the one-cycle non-all-zero bit pattern included in the first test pattern and the one-cycle non-all-zero bit pattern included in the second test pattern are not co-located bit patterns. For another example, the at least one test pattern may include a first test pattern and a second test pattern, and the one-cycle non-all-zero bit pattern included in the first test pattern is different from the one-cycle non-all-zero bit pattern included in the second test pattern. The one-cycle non-all-zero bit pattern included in the first test pattern and the one-cycle non-all-zero bit pattern included in the second test pattern may have different numbers of 1's included therein.

According to a third aspect of the present invention, a method for testing a device under test is disclosed. The method includes at least the following steps: generating at least one test pattern; feeding the at least one test pattern at a first clock rate into the device under test; sampling the at least one test pattern by using a second clock rate and accordingly generate at least one sampled test pattern, wherein the second clock rate is higher than the first clock rate; performing a designated function upon the at least one sampled test pattern and accordingly generating at least one functional test result; and outputting the at least one functional test result.

In one embodiment, each test pattern includes a one-cycle non-all-zero bit pattern sandwiched by a preceding one-cycle all-zero bit pattern and a following one-cycle all-zero bit pattern. For one example, the step of generating the at least one test pattern includes: generating a first test pattern and a second test pattern, wherein the one-cycle non-all-zero bit pattern included in the first test pattern is identical to the one-cycle non-all-zero bit pattern included in the second test pattern, and the one-cycle non-all-zero bit pattern included in the first test pattern and the one-cycle non-all-zero bit pattern included in the second test pattern are not co-located bit patterns. For another example, the step of generating the at least one test pattern includes: generating a first test pattern and a second test pattern, wherein the one-cycle non-all-zero bit pattern included in the first test pattern is different from the one-cycle non-all-zero bit pattern included in the second test pattern. The one-cycle non-all-zero bit pattern included in the first test pattern and the one-cycle non-all-zero bit pattern included in the second test pattern may have different numbers of 1's included therein.

In one embodiment, the device under test is a flash memory controller chip.

In one embodiment, the step of performing the designated function includes: utilizing an error checking and correction (ECC) circuit to perform the designated function. The designated function is an ECC decoding operation. The ECC circuit uses shared circuitry to perform an ECC encoding operation and the ECC decoding operation.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
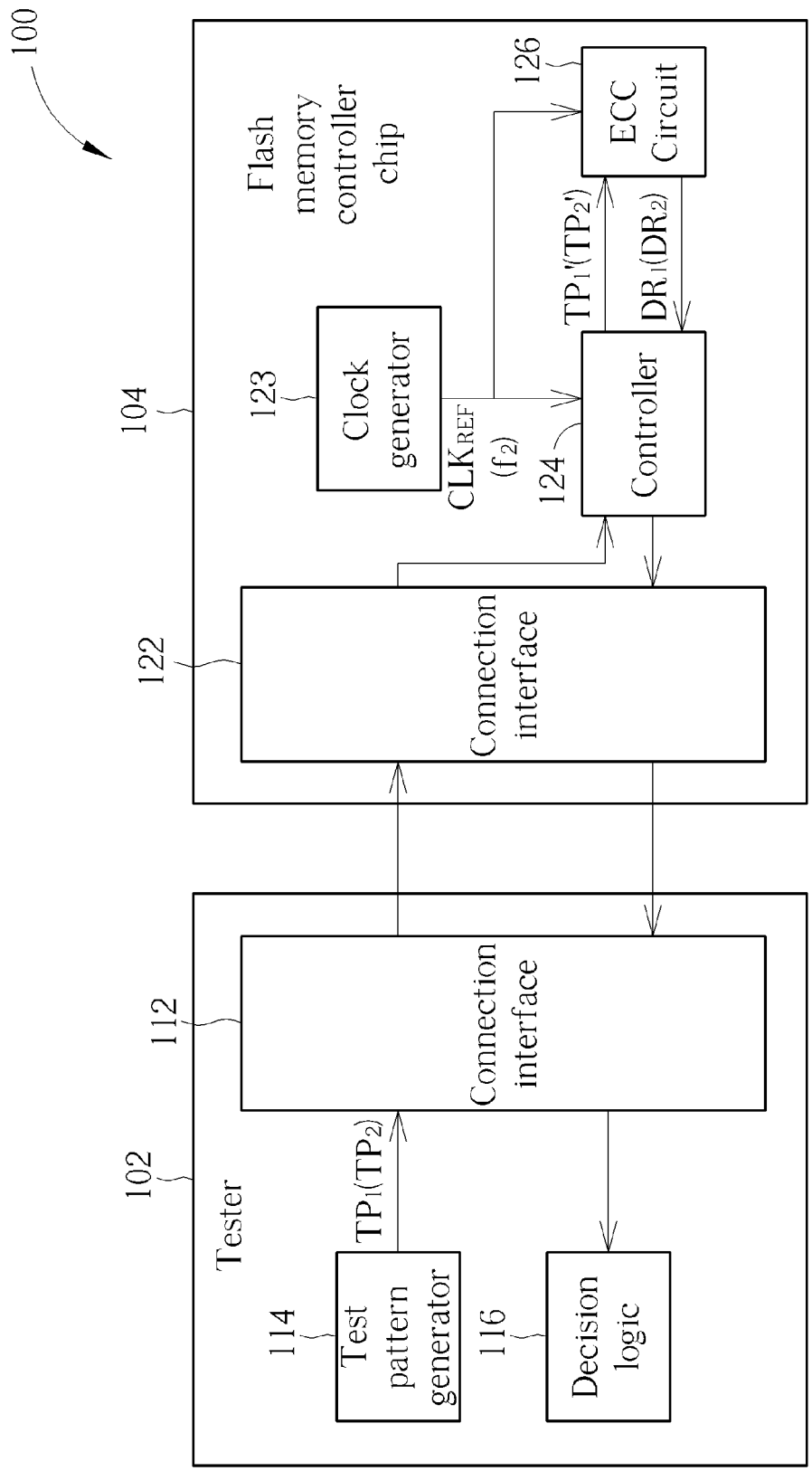
FIG. 1 is a diagram illustrating a testing system according to an embodiment of the present invention.

FIG. 1 is a diagram illustrating a testing system according to an embodiment of the present invention. The testing system 100 includes test equipment (e.g., a tester 102) and a device under test (e.g., a flash memory controller chip 104). The tester 102 includes a connection interface 112, a test pattern generator 114 and a decision logic 116. The flash memory controller chip 104 includes a connection interface 122, an on-chip clock source (e.g., a clock generator 123), a controller 124, and a function block (e.g., an error checking and correction (ECC) circuit 126). It should be noted that only the elements pertinent to the present invention are shown in FIG. 1. In practice, the tester 102 may have additional element(s) included therein, and/or the flash memory controller chip 104 may have additional element(s) included therein.

The tester 102 and the flash memory controller chip 104 are connected through connection interfaces 112, 122, which act as input/output (I/O) interfaces. For example, the connection interface 112 may include probes, and the connection interface 122 may include contacts. In this embodiment, the tester 102 is a lower-speed tester for providing test data at a lower clock rate, while the flash memory controller chip 104 is configured to control access (read/write) of a flash memory (not shown) at a higher clock rate under a normal operation. The present invention proposes applying at-speed functional test, instead of a conventional scan chain based at-speed test, to the flash memory controller chip 104 by feeding a lower-speed test data into the flash memory controller chip 104. Further details are described as below.

The test pattern generator 114 in the tester 102 is arranged to generate a test pattern $TP_1$ composed a plurality of bit patterns. By way of example, but not limitation, each bit pattern is composed of eight bits (i.e., one byte). The test pattern generator 114 outputs the test pattern $TP_1$ to the connection interface 112. In this embodiment, the connection interface 112 is arranged to transmit one bit pattern (i.e., one byte) per clock cycle, where the test pattern $TP_1$ is transmitted at a first clock rate $f_1$. Hence, the connection interface 122 in the flash memory controller chip 104 is arranged to receive the test pattern $TP_1$ transmitted at the first clock rate $f_1$, and forwards the received test pattern $TP_1$ to the controller 124. The clock generator 123 is arranged to generate an internal reference clock $CLK_{REF}$ to the controller 124 and the ECC circuit 126, wherein the internal reference clock $CLK_{REF}$ has a second clock rate $f_2$ higher than the first clock rate $f_1$. For example, the clock generator 123 may be implemented using a phase-locked loop (PLL). The controller 124 and the ECC circuit 126 operate based on the internal reference clock $CLK_{REF}$. In this embodiment, the controller 124 is arranged to sample the test pattern $TP_1$ by using the second clock rate $f_2$, and accordingly generate a sampled test pattern $TP_1'$. The ECC circuit 126 is arranged to perform a designated function (e.g., an ECC decoding operation) upon the sampled test pattern $TP_1'$, and accordingly generate a decoding result DR1 as a functional test result. Next, the controller 124 transmits the functional test result (i.e., $DR_1$) generated in response to the test pattern $TP_1$ to the decision logic 116 through the connection interfaces 112, 122. That is, the connection interface 122 at the flash memory controller chip 104 outputs the functional test result (i.e., $DR_1$), and the connection interface 112 at the tester 102 receives the functional test result (i.e., $DR_1$). Next, the decision logic 116 refers to the functional test result (i.e., $DR_1$) to determine if the flash memory controller chip 104 passes the at-speed functional test.

It should be noted that the flash memory controller chip 104 is controlled to operate under a normal function mode when undergoing the at-speed functional test. Besides, a read flash memory action is taken by the controller 124 to obtain the sampled test pattern $TP_1'$ as a stored data read from the flash memory (not shown). In other words, the sampled test pattern $TP_1'$ is a pseudo flash memory data derived from sampling the test pattern $TP_1$ provided by the tester 102. The ECC circuit 126 may treat successive bits of the sampled test pattern $TP_1'$ as a codeword to be decoded. As the ECC circuit 126 is devised to have error checking and correction capability, error bits present in the sampled test pattern $TP_1'$ should be corrected by the ECC circuit 126, if the number of error bits does not exceed an acceptable level. Assuming that the ECC circuit 126 in this embodiment is configured to decode a BCH (Bose, Ray-Chaudhuri and Hocquenghem) codeword having 980 parity bits included therein, the ECC circuit 126 is therefore able to correct at most 70 error bits found in a data block of the BCH codeword. To achieve the objective of performing the functional test upon the ECC circuit 126 by using a lower-speed tester, the test pattern generator 114 needs to generate the test pattern $TP_1$ based the error checking and correction capability of the ECC circuit 126 and a frequency ratio of second clock rate $f_2$ to first clock rate $f_1$. As the second clock rate $f_2$ is higher than the first clock rate $f_1$, a bit pattern transmitted in one clock cycle would be sampled by the controller 124 several times. In a case where the ECC circuit 126 is able to correct at most M bits and the frequency ratio of second clock rate $f_2$ to first clock rate $f_1$ is K (i.e., $K=f_2/f_1$), the number N of error bits intentionally included in the test pattern $TP_1$ is required to meet the condition: $N*L \le M$. Hence, error bits included in the sampled test pattern $TP_1'$ are ensured to be corrected by the ECC circuit 126 if the ECC circuit 126 has no defect. That is, the decoding result $DR_1$ should be error-free if the ECC circuit 126 works normally; otherwise, the flash memory controller chip 104 fails to pass the at-speed functional test.

Figure 2:
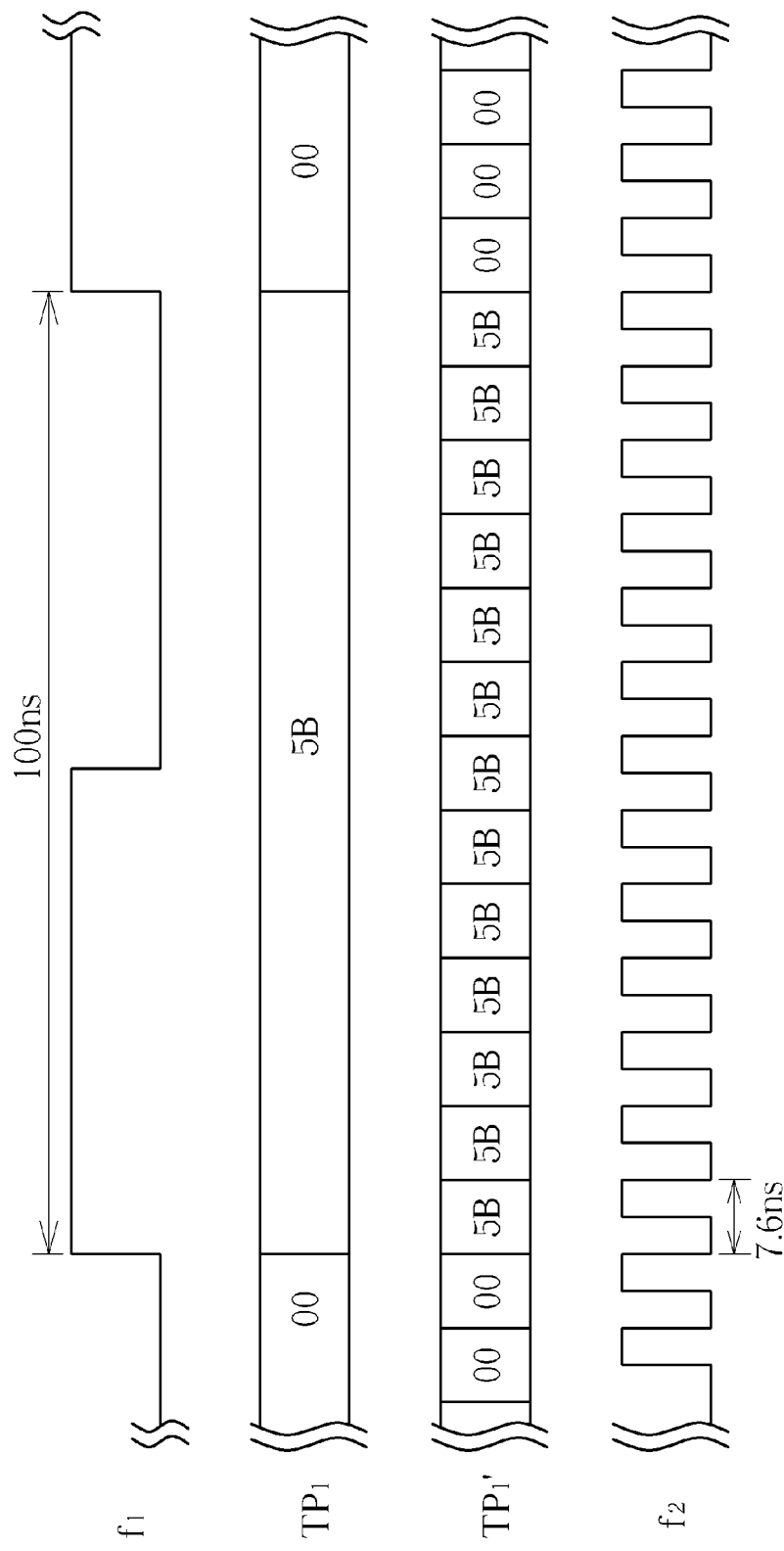
FIG. 2 is a diagram illustrating an example of a test pattern generated from the test pattern generator and a sampled test pattern obtained by the controller.

Please refer to FIG. 2, which is a diagram illustrating an example of a test pattern generated from the test pattern generator 114 and a sampled test pattern obtained by the controller 124. As shown in FIG. 2, the test pattern $TP_1$ transmitted from the tester 102 has a one-cycle non-all-zero bit pattern "5B" (i.e., 01011011) sandwiched by a preceding one-cycle all-zero bit pattern "00" (i.e., 00000000) and a following one-cycle all-zero bit pattern "00" (i.e., 00000000), where the one-cycle non-all-zero bit pattern "5B" is used to intentionally introduce error bits. Preferably, the test pattern $TP_1$ may have multiple successive one-cycle all-zero bit patterns "00" followed by the one-cycle non-all-zero bit pattern "5B", and have multiple successive one-cycle all-zero bit patterns "00" following the one-cycle non-all-zero bit pattern "5B". In this example, the first clock rate $f_1$ is 10 MHz (megahertz), and the second clock rate $f_2$ is 130 MHz. Hence, one external clock cycle is exactly equal to 100 ns (nanosecond), and one internal clock cycle is roughly equal to 7.6 ns. As a result, the non-all-zero bit pattern "5B" (i.e., one-byte "5B" pattern) transmitted in one external clock cycle is sampled 13 times to produce a 13-byte "5B" pattern in the sampled test pattern $TP_1'$. Specifically, the one-cycle non-all-zero bit pattern "5B" have five 1's and three 0's, and the test pattern $TP_1'$ may be regarded as an all-zero codeword having a data block intentionally modified by a 13-byte "5B" pattern which acts as an error pattern having 65 error bits (i.e., 1's) distributed therein. Assume that the ECC circuit 126 is able to correct at most 70 error bits found in a data block of a BCH codeword. If the ECC circuit 126 has no defect included therein, the decoding result $DR_1$ should be an all-zero data block. Therefore, the decision logic 116 can check the decoding result $DR_1$ to determine if the flash memory controller chip 104 is a normal chip or a failed/faulty chip.

In above embodiment, the tester 102 may generate a single test pattern to apply at-speed functional test to a flash memory controller chip. However, this is for illustrative purposes only, and is not meant to be a limitation of the present invention. To improve the testability, the tester 102 may be configured to generate a plurality of test patterns sequentially, and then determine if the flash memory controller chip is a normal chip or a failed/faulty chip based on a plurality of functional test results sequentially generated in response to the test patterns. Please refer to FIG. 1 again. In an alternative design, the test pattern generate 114 further generates another test pattern $TP_2$, the controller 124 further generates another sampled test pattern $TP_2'$ by sampling the test pattern $TP_2$, and the ECC circuit 126 further performs an ECC decoding operation upon the sampled test pattern $TP_2'$ to generate a decoding result $DR_2$ acting as a functional test result. As a person skilled in the art can readily understand details of the at-speed functional test based on the test pattern $TP_2$ after reading above paragraphs directed to the at-speed functional test based on the test pattern $TP_1$, further description is omitted here for brevity.

Figure 3:
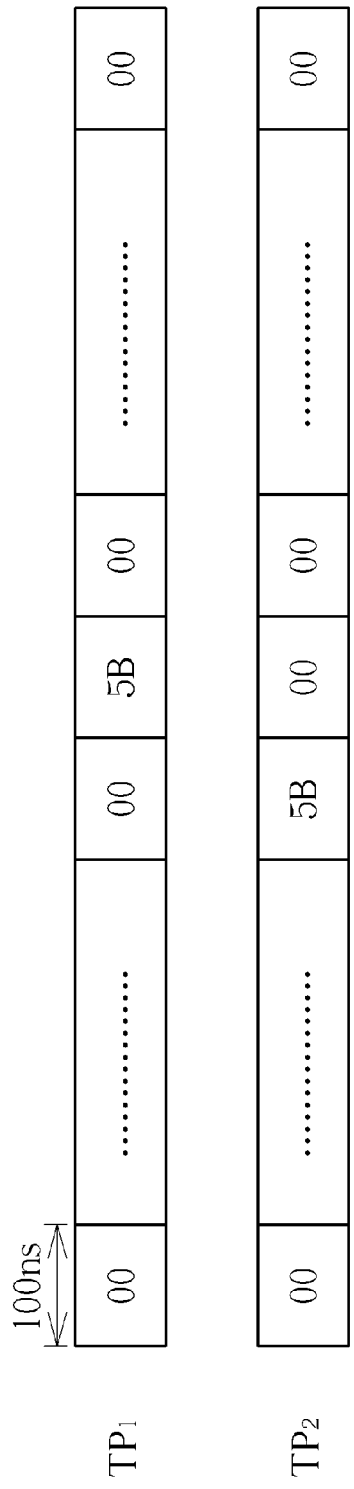
FIG. 3 is a diagram illustrating a first example of different test patterns generated from the test pattern generator shown in FIG. 1.

The test pattern $TP_2$ differs from the test pattern $TP_1$ in terms of a pattern location and/or a pattern content of the one-cycle non-all-zero bit pattern. FIG. 3 is a diagram illustrating a first example of different test patterns generated from the test pattern generator 114 shown in FIG. 1. As shown in the figure, each of the test patterns $TP_1$ and $TP_2$ includes the same one-cycle non-all-zero bit pattern "5B" sandwiched by a preceding one-cycle all-zero bit pattern "00" and a following one-cycle all-zero bit pattern "00". However, the one-cycle non-all-zero bit pattern "5B" in the test pattern $TP_1$ and the one-cycle non-all-zero bit pattern "5B" in the test pattern $TP_2$ are not co-located bit patterns. In this example, compared to the one-cycle non-all-zero bit pattern "5B" in the test pattern $TP_1$, the one-cycle non-all-zero bit pattern "5B" in the test pattern $TP_2$ is transmitted earlier by one external clock cycle.

Figure 4:
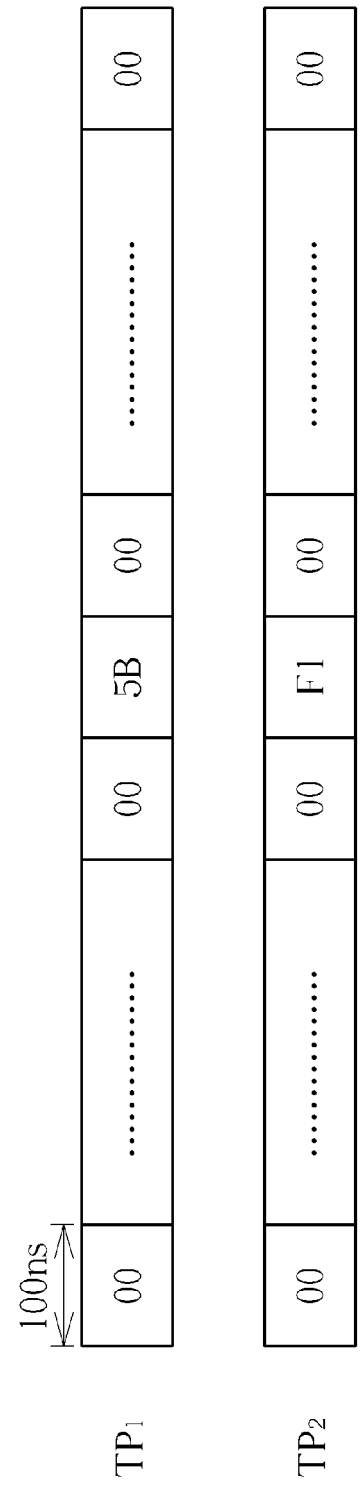
FIG. 4 is a diagram illustrating a second example of different test patterns generated from the test pattern generator shown in FIG. 1.

FIG. 4 is a diagram illustrating a second example of different test patterns generated from the test pattern generator 114 shown in FIG. 1. As shown in the figure, the test pattern $TP_1$ includes a one-cycle non-all-zero bit pattern "5B" sandwiched by a preceding one-cycle all-zero bit pattern "00" and a following one-cycle all-zero bit pattern "00", and the test pattern $TP_2$ includes a different one-cycle non-all-zero bit pattern "F1" sandwiched by a preceding one-cycle all-zero bit pattern "00" and a following one-cycle all-zero bit pattern "00". In this example, the one-cycle non-all-zero bit pattern "5B" in the test pattern $TP_1$ and the one-cycle non-all-zero bit pattern "F1" (i.e., 11110001) in the test pattern $TP_2$ are co-located bit patterns.

Figure 5:
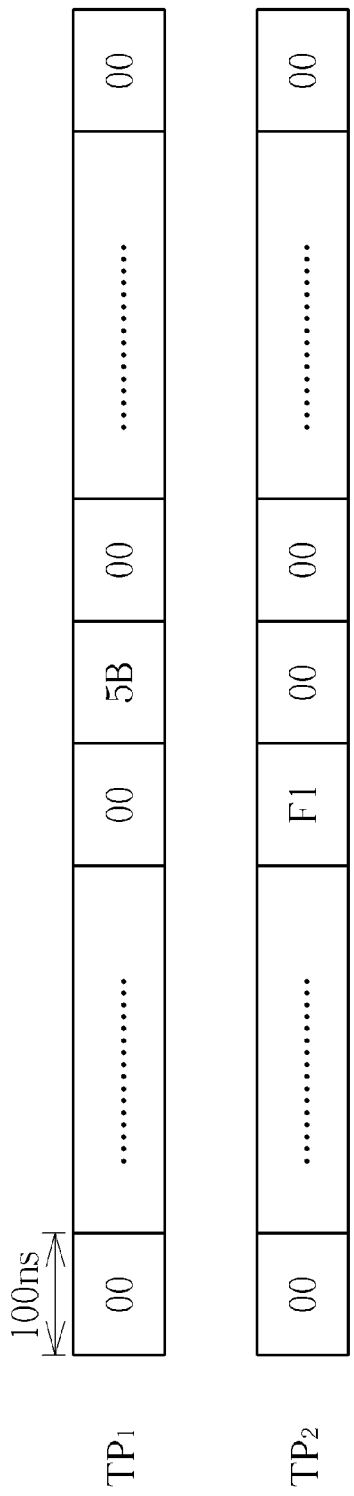
FIG. 5 is a diagram illustrating a third example of different test patterns generated from the test pattern generator shown in FIG. 1.

FIG. 5 is a diagram illustrating a third example of different test patterns generated from the test pattern generator 114 shown in FIG. 1. As shown in the figure, the test pattern $TP_1$ includes a one-cycle non-all-zero bit pattern "5B" sandwiched by a preceding one-cycle all-zero bit pattern "00" and a following one-cycle all-zero bit pattern "00", and the test pattern $TP_2$ includes a different one-cycle non-all-zero bit pattern "F1" sandwiched by a preceding one-cycle all-zero bit pattern "00" and a following one-cycle all-zero bit pattern "00". In this example, the one-cycle non-all-zero bit pattern "5B" in the test pattern $TP_1$ and the one-cycle non-all-zero bit pattern "F1" in the test pattern $TP_2$ are not co-located bit patterns.

In above examples, each of the non-all-zero bit patterns "5B" and "F1" have the same number of 1's (i.e., error bits) included therein. However, this is for illustrative purposes only, and is not meant to be a limitation of the present invention. Alternatively, the one-cycle non-all-zero bit patterns in the test patterns $TP_1$ and $TP_2$ may have different numbers of 1's (i.e., error bits). The same objective of applying an at-speed functional test to a device under test with a lower-speed tester is achieved.

Figure 6:
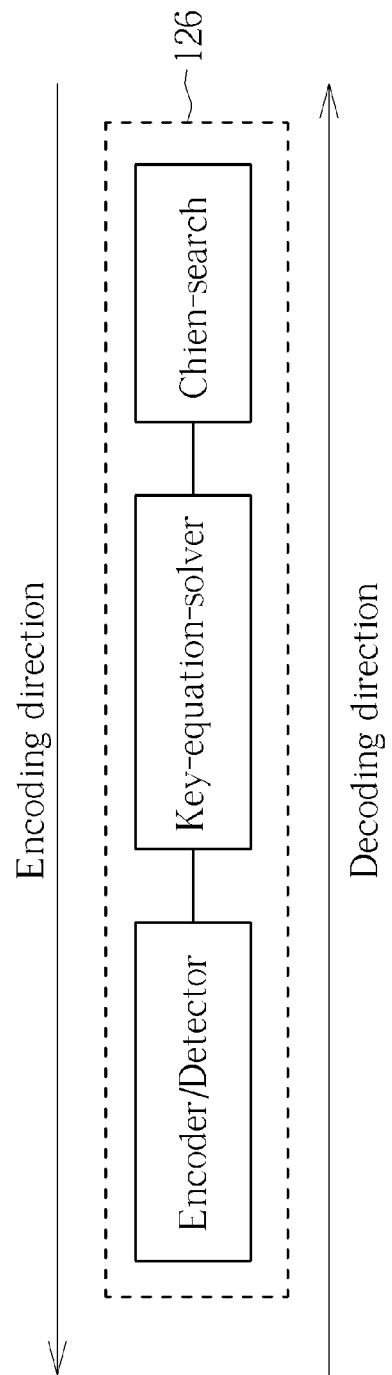
FIG. 6 is a diagram illustrating an example of the ECC circuit shown in FIG. 1.

In one exemplary design, the ECC circuit 126 is a configurable ECC engine which is responsible for performing the ECC encoding operation as well as the ECC decoding operation. Please refer to FIG. 6, which is a diagram illustrating an example of the ECC circuit 126 shown in FIG. 1. In this example, the ECC circuit 126 is arranged to use shared circuitry to perform the ECC encoding operation and the ECC decoding operation. More specifically, as the ECC circuit 126 is configurable, the ECC circuit 126 may configured to serve as an ECC encoder or an ECC decoder. Though the at-speed functional test is to obtain a functional test result generated by the ECC decoding function, the ECC encoding function will also be under tested due to the fact that ECC encoding function and ECC decoding function are performed using the same circuitry.

Figure 7:
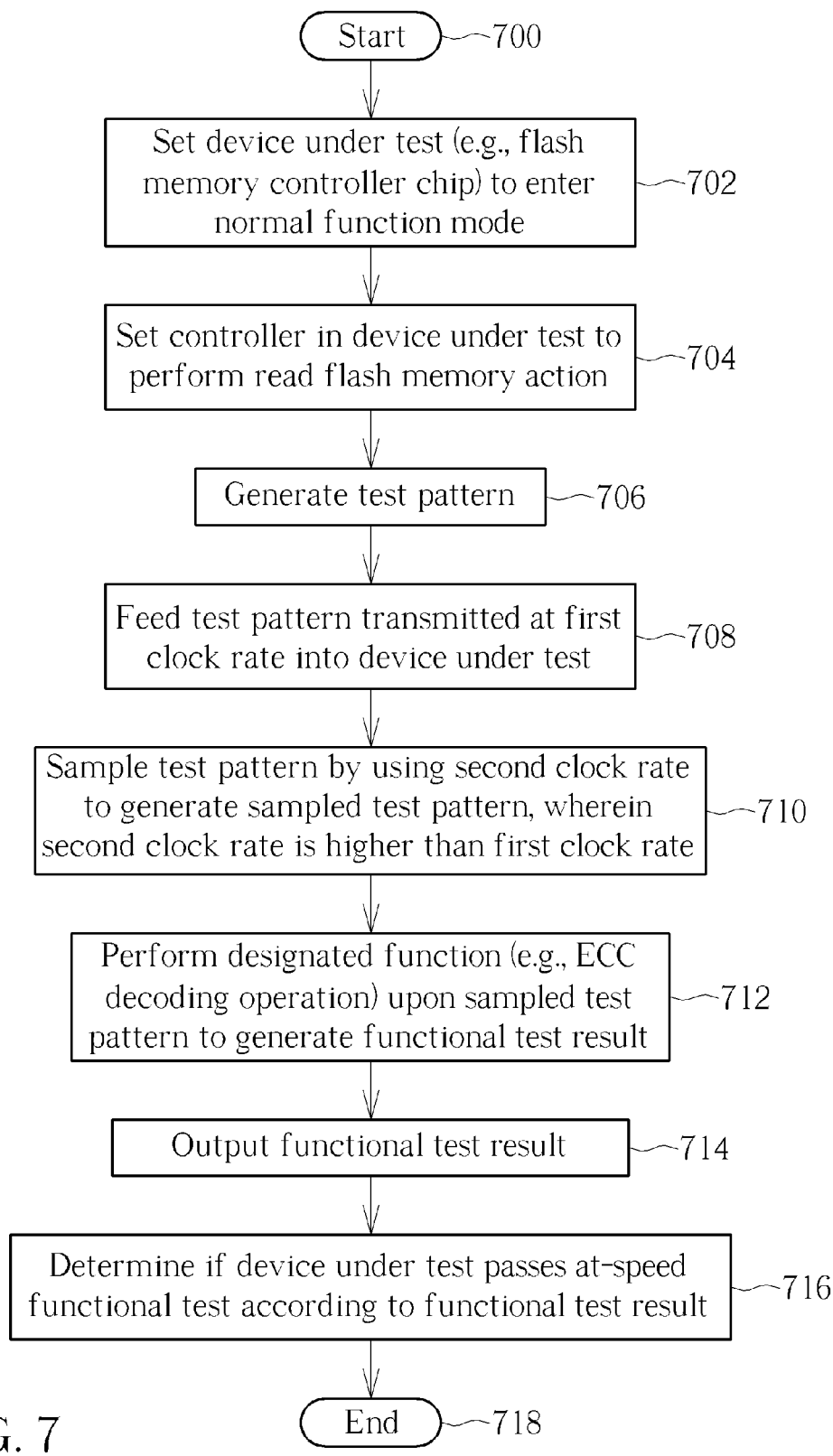
FIG. 7 is a flowchart illustrating a method for testing a device under test according to an embodiment of the present invention.

FIG. 7 is a flowchart illustrating a method for testing a device under test according to an embodiment of the present invention. Provided that the result is substantially the same, the steps are not required to be executed in the exact order shown in FIG. 7. The method may be employed by the testing system 100 shown in FIG. 1, and may be briefly summarized as follows.

Step 700: Start.

Step 702: Set a device under test (e.g., flash memory controller chip 104) to enter a normal function mode.

Step 704: Set the controller 124 to perform the read flash memory action.

Step 706: Generate at least one test pattern.

Step 708: Feed the at least one test pattern transmitted at a first clock rate into the device under test.

Step 710: Sample the at least one test pattern by using a second clock rate and accordingly generate at least one sampled test pattern, wherein the second clock rate is higher than the first clock rate.

Step 712: Perform a designated function (e.g., an ECC decoding operation) upon the at least one sampled test pattern and accordingly generate at least one functional test result.

Step 714: Output the at least one functional test result.

Step 716: Determine if the device under test passes the at-speed functional test according to the at least one functional test result.

Step 718: End.

As a person skilled in the art can readily understand details of each step shown in FIG. 7 after reading above paragraphs, further description is omitted here for brevity.

In aforementioned embodiments, the flash memory controller chip 104 merely serves as one example of a device under test which is tested using the proposed at-speed functional test scheme based on a lower-speed test pattern input. The proposed at-speed functional test scheme based on a lower-speed test pattern input may be employed to test other semiconductor products. For example, the proposed at-speed functional test scheme based on a lower-speed test pattern input may be employed to test any semiconductor product equipped with the ECC decoding functionality. These alternative designs all fall within the scope of the present invention.

In aforementioned embodiments, the ECC circuit 126 merely serves as one example of a functional block which is responsible for processing a sampled test pattern to generate a functional test result of a device under test. The sampled test pattern derived from using a higher clock rate to sample a test pattern provided by a lower-speed tester may be fed into a different functional block of another device under test to thereby apply at-speed functional test to another device under test. These alternative designs all fall within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for testing a device under test, comprising:
generating at least one test pattern;
feeding the at least one test pattern transmitted at a first clock rate into the device under test;
sampling the at least one test pattern by using a second clock rate and accordingly generate at least one sampled test pattern, wherein the second clock rate is higher than the first clock rate;
performing a designated function upon the at least one sampled test pattern and accordingly generating at least one functional test result;
outputting the at least one functional test result;
wherein the sampling step comprises:
sampling the at least one test pattern by using the second clock rate to generate a plurality of duplicated test patterns served as the at least one sampled test pattern.

2. The method of claim 1, wherein each test pattern transmitted includes a one-clock-cycle non-all-zero bit pattern sandwiched by a preceding one-clock-cycle all-zero bit pattern and a following one-clock-cycle all-zero bit pattern.

3. The method of claim 2, wherein the step of generating the at least one test pattern comprises:
generating a first test pattern and a second test pattern, wherein the one-clock-cycle non-all-zero bit pattern included in the first test pattern is identical to the one-clock-cycle non-all-zero bit pattern included in the second test pattern, and the one-clock-cycle non-all-zero bit pattern included in the first test pattern and the one-clock-cycle non-all-zero bit pattern included in the second test pattern are not co-located bit patterns.

4. The method of claim 2, wherein the step of generating the at least one test pattern comprises:
generating a first test pattern and a second test pattern, wherein the one-clock-cycle non-all-zero bit pattern included in the first test pattern is different from the one-clock-cycle non-all-zero bit pattern included in the second test pattern.

5. The method of claim 4, wherein the one-clock-cycle non-all-zero bit pattern included in the first test pattern and the one-clock-cycle non-all-zero bit pattern included in the second test pattern have different numbers of 1's included therein.

6. The method of claim 1, wherein the device under test is a flash memory controller chip.

7. The method of claim 1, wherein the step of performing the designated function comprises:
utilizing an error checking and correction (ECC) circuit to perform the designated function.

8. The method of claim 7, wherein the designated function is an ECC decoding operation.

9. The method of claim 8, wherein the ECC circuit is configured to use shared circuitry to perform an ECC encoding operation and the ECC decoding operation.

10. A method for testing a device under test, comprising:
generating at least one test pattern;
feeding the at least one test pattern transmitted at a first clock rate into the device under test;
sampling the at least one test pattern by using a second clock rate and accordingly generate at least one sampled test pattern, wherein the second clock rate is higher than the first clock rate;
performing a designated function upon the at least one sampled test pattern and accordingly generating at least one functional test result;

outputting the at least one functional test result;
wherein the step of generating the at least one test pattern comprises:
  generating the at least one test pattern to intentionally introduce error bits; and
the sampling step comprises:
  sampling the at least one test pattern by using the second clock rate to generate a plurality of duplicated test patterns served as the at least one sampled test pattern; and
the step of performing the designated function comprises:
  utilizing an error checking and correction (ECC) circuit to perform the designated function.

* * * * *